United States Patent
Ju et al.

(10) Patent No.: US 6,798,622 B2
(45) Date of Patent: Sep. 28, 2004

(54) MAGNETORESISTIVE (MR) SENSOR ELEMENT WITH SUNKEN LEAD STRUCTURE

(75) Inventors: Kochan Ju, Fremont, CA (US); Jei-Wei Chang, Cupertino, CA (US); Cheng Horng, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/370,346

(22) Filed: Feb. 19, 2003

(65) Prior Publication Data

US 2003/0150835 A1 Aug. 14, 2003

Related U.S. Application Data

(63) Continuation of application No. 09/733,528, filed on Dec. 11, 2000, now abandoned.

(51) Int. Cl.[7] ............................................. G11B 5/127
(52) U.S. Cl. ........................................................ 360/322
(58) Field of Search ............................. 360/322, 317, 360/327.2, 125, 126; 29/603.14

(56) References Cited

U.S. PATENT DOCUMENTS

| | | | |
|---|---|---|---|
| 4,782,414 A | | 11/1988 | Krounbi et al. |
| 5,141,623 A | * | 8/1992 | Cohen et al. ............... 205/122 |
| 5,491,600 A | | 2/1996 | Chen et al. |
| 5,508,866 A | * | 4/1996 | Gill et al. ................. 360/327.2 |
| 5,658,469 A | | 8/1997 | Jennison ....................... 216/22 |
| 5,666,248 A | | 9/1997 | Gill |
| 5,739,990 A | | 4/1998 | Ravipati et al. |
| 5,772,794 A | | 6/1998 | Uno et al. ................... 148/108 |
| 5,850,324 A | * | 12/1998 | Wu et al. ..................... 360/322 |
| 6,043,959 A | * | 3/2000 | Crue et al. ................... 360/317 |
| 6,353,995 B1 | * | 3/2002 | Sasaki et al. ............. 29/603.14 |
| 6,493,194 B1 | * | 12/2002 | Sakaguchi et al. ........... 360/322 |

* cited by examiner

*Primary Examiner*—Allen Cao
(74) *Attorney, Agent, or Firm*—George O. Saile; Stephen B. Ackerman

(57) ABSTRACT

A method for forming a magnetoresistive (MR) sensor element. There is first provided a substrate. There is then formed over the substrate a seed layer. There is then formed contacting a pair of opposite ends of the seed layer a pair of patterned conductor lead layer structures. There is then etched, while employing an ion etch method, the seed layer and the pair of patterned conductor lead layer structures to form an ion etched seed layer and a pair of ion etched patterned conductor lead layer structures. Finally, there is then formed upon the ion etched seed layer and the pair of ion etched patterned conductor lead layers structures a magnetoresistive (MR) layered structure. Within the magnetoresistive (MR) sensor element, the pair of patterned conductor lead layer structures may be formed within a pair of recesses within an ion etch recessed dielectric isolation layer.

3 Claims, 3 Drawing Sheets

MAGNETORESISTIVE (MR) SENSOR ELEMENT WITH SUNKEN LEAD STRUCTURE

This is a continuation of U.S. patent application Ser. No. 09/733,528, filing date Dec. 11, 2000 now abandoned, Magnetoresistive (Mr) Sensor Element With Sunken Lead Structure, assigned to the same assignee as the present invention.

BACKGROUND OF THE INVENTION

1. Field of the Invention

The present invention relates generally to magnetoresistive (MR) sensor elements employed within magnetic data storage and retrieval. More particularly, the present invention relates to methods for fabricating with enhanced electrical and magnetic properties magnetoresistive (MR) sensor elements employed within magnetic data storage and retrieval.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein.

Within the general category of magnetoresistive (MR) sensor elements, magnetoresistive (MR) sensor elements whose operation is predicated upon a giant magnetoresistive (GMR) effect are presently of considerable interest insofar as those magnetoresistive (MR) sensor elements typically exhibit enhanced levels of magnetoresistive (MR) resistivity sensitivity (i.e. a higher magnetoresistive (MR) coefficient, dR/R) in comparison with magnetoresistive (MR) sensor elements whose operation is predicated upon magnetoresistive (MR) effects other than the giant magnetoresistive (GMR) effect. The giant magnetoresistive GMR effect is understood by a person skilled in the art to be exhibited by a magnetoresistive (MR) sensor element fabricated employing a series of ferromagnetic layers having interposed therebetween a series of non-magnetic conductor spacer layers, where the thicknesses of each non-magnetic conductor spacer layer within the series of non-magnetic conductor spacer layers is chosen such that adjacent ferromagnetic layers within the series of ferromagnetic layers are magnetically coupled and biased anti-parallel.

Magnetoresistive (MR) sensor elements exhibiting enhanced magnetoresistive (MR) resistivity sensitivity are desirable within the art of magnetoresistive (MR) sensor element fabrication since such enhanced magnetoresistive (MR) resistivity sensitivity clearly inherently allows for detection within a magnetic data storage media of weaker magnetic signals with increased linear density and thus also inherently allows for an increased-areal density of the magnetic data storage medium within a magnetic data storage enclosure which employs the magnetoresistive (MR) sensor element which exhibits the enhanced magnetoresistive (MR) resistivity sensitivity.

A typical commercial embodiment of a magnetoresistive (MR) sensor element whose operation is predicated upon the giant magnetoresistive (GMR) effect is a spin-valve magnetoresistive (SVMR) sensor element. Spin-valve magnetoresistive (SVMR) sensor elements typically employ a pair of ferromagnetic layers separated by a non-magnetic conductor spacer layer, where a first ferromagnetic layer within the pair of ferromagnetic layers is additionally magnetically pinned through contact with a hard magnetic material layer to provide a fixed magnetization angle between a first magnetization direction within the magnetically pinned first ferromagnetic layer and a second magnetization direction within the second ferromagnetic layer which is un-pinned. The un-pinned second ferromagnetic layer is alternatively referred to as a free ferromagnetic layer. The giant magnetoresistive (GMR) effect within a spin-valve magnetoresistive (SVMR) sensor element is predicated upon differential electron scattering trajectories within the spin-valve magnetoresistive (SVMR) sensor element incident to magnetic data recording media biasing of a free ferromagnetic layer with respect to a magnetically pinned ferromagnetic layer within the spin-valve magnetoresistive (SVMR) sensor element.

Although magnetoresistive (MR) sensor elements, including spin-valve magnetoresistive (SVMR) sensor elements, are thus well known in the art of magnetic data storage and retrieval, it is nonetheless important within the art of magnetic data storage and retrieval that magnetoresistive (MR) sensor elements are fabricated with enhanced electrical and magnetic properties.

It is thus towards the goal of fabricating for use within magnetic data storage and retrieval magnetoresistive (MR) sensor elements, such as spin-valve magnetoresistive (SVMR) sensor elements, while fabricating the magnetoresistive (MR) sensor elements with enhanced electrical and/or magnetic properties, that the present invention is directed.

Various magnetoresistive (MR) sensor elements and methods for fabricating magnetoresistive (MR) sensor elements, including but not limited to magnetoresistive (MR) sensor elements whose operation is predicated upon a giant magnetoresistive (GMR) effect, have been disclosed within the art of magnetoresistive (MR) sensor element fabrication.

For example, Krounbi et al., in U.S. Pat. No. 4,782,414, discloses a magnetoresistive (MR) sensor element where a trackwidth of a magnetoresistive (MR) layer within the magnetoresistive (MR) sensor element is defined by other than a separation distance of a pair of patterned conductor lead layers formed contacting the magnetoresistive (MR) layer within the magnetoresistive (MR) sensor element. Within the magnetoresistive (MR) sensor element the trackwidth of the patterned magnetoresistive (MR) layer is instead determined by a linewidth of a patterned dielectric layer formed upon the patterned magnetoresistive (MR) layer prior to forming contacting the patterned magnetoresistive (MR) layer and the patterned dielectric layer the pair of patterned conductor lead layers.

In addition, Chen et al., in U.S. Pat. No. 5,491,600, discloses a magnetoresistive (MR) sensor element having incorporated therein a patterned conductor lead layer structure with enhanced mechanical strength and reduced surface topography with respect to a magnetoresistive (MR) layered structure within the magnetoresistive (MR) sensor element. To realize the foregoing objects, the magnetoresistive (MR) sensor element employs a patterned conductor lead layer structure formed of interleaved layers of refractory metal layers and highly conductive metal layers, where the patterned conductor lead layer structure abuts a sidewall of the magnetoresistive (MR) layered structure within the magnetoresistive (MR) sensor element.

Further, Jennison, in U.S. Pat. No. 5,658,469, discloses a method for forming, with a re-entrant profile, a patterned photoresist layer which may be employed as a lift off mask for forming patterned layers when fabricating magnetoresistive (MR) sensor elements. The method employs a patterned photoresist layer formed upon a substrate, an upper portion of which patterned photoresist layer is cross-linked and insolubilized with respect to a solvent, while a lower portion of which patterned photoresist layer is soluble with respect to the solvent, such that when developed within the solvent there is formed within the patterned photoresist layer a re-entrant profile with respect to the substrate.

With respect more particularly to magnetoresistive (MR) sensor elements whose operation is predicated upon a giant magnetoresistive (GMR) effect, Gill, in U.S. Pat. No. 5,666,248, discloses a spin-valve magnetoresistive (SVMR) sensor element wherein there is avoided completely the use of an antiferromagnetic pinning material layer for magnetically pinning a pinned ferromagnetic layer within the spin-valve magnetoresistive (SVMR) sensor element. The spin-valve magnetoresistive (SVMR) sensor element instead employs a sense current assisted ferromagnetic coupling of a free ferromagnetic layer and the pinned ferromagnetic layer within the spin-valve magnetoresistive (SVMR) sensor element, along with a pair of ferromagnetic flux guides formed at a pair of opposite edges of the spin-valve magnetoresistive (SVMR) sensor element and including an air bearing surface edge of the spin-valve magnetoresistive (SVMR) sensor element.

Similarly, Ravipati et al., in U.S. Pat. No. 5,739,990, discloses a spin-valve magnetoresistive (SVMR) sensor element with an improved electrical bias structure of the spin-valve magnetoresistive (SVMR) sensor element and a comparatively low resistivity of the spin-valve magnetoresistive (SVMR) sensor element. The spin-valve magnetoresistive (SVMR) sensor element employs a pair of patterned conductor lead layers laterally abutting a ferromagnetic layer within the spin-valve magnetoresistive (SVMR) sensor element, where the patterned conductor lead layers have formed thereover and contacting a top surface of the ferromagnetic layer a pair of longitudinal magnetic biasing layers which define a trackwidth of the spin-valve magnetoresistive (SVMR) sensor element.

Finally, Uno et al., in U.S. Pat. No. 5,772,794, disclose a method for fabricating a spin-valve magnetoresistive (SVMR) sensor element while optimally preserving a magnetic anisotropy of a ferromagnetic layer within the spin-valve magnetoresistive (SVMR) sensor element. The method realizes the foregoing object by employing when fabricating the spin valve magnetoresistive (SVMR) sensor element a final thermal annealing of the spin valve magnetoresistive (SVMR) sensor element at an appropriate temperature and extrinsic magnetic bias field.

Desirable in the art of magnetoresistive (MR) sensor element fabrication are additional methods which may be employed for forming magnetoresistive (MR) sensor elements, such as spin-valve magnetoresistive (SVMR) sensor elements, with enhanced electrical and/or magnetic properties.

It is towards that object that the present invention is directed.

SUMMARY OF THE INVENTION

A first object of the present invention is to provide a method for forming a magnetoresistive (MR) sensor element, such as a spin-valve magnetoresistive (SVMR) sensor element.

A second object of the present invention is to provide a method in accord with the first object of the present invention, where the magnetoresistive (MR) sensor element has enhanced electrical and/or magnetic properties.

A third object of the present invention is to provide a method in accord with the first object of the present invention and the second object of the present invention, which method is readily commercially implemented.

In accord with the objects of the present invention, there is provided by the present invention a method for fabricating a magnetoresistive (MR) sensor element. To practice the method of the present invention, there is first provided a substrate. There is then formed over the substrate a seed layer. There is then formed contacting a pair of opposite ends of the seed layer a pair of patterned conductor lead layer structures. There is then etched, while employing an ion etch method, the seed layer and the pair of patterned conductor lead layer structures to form an ion etched seed layer and a pair of ion etched patterned conductor lead layer structures. Finally, there is then formed upon the ion etched seed layer and the pair of ion etched patterned conductor lead layer structures a magnetoresistive (MR) layered structure.

The present invention also includes a specific geometric disposition of the pair of patterned conductor lead layer structures sunken within a dielectric isolation layer employed for forming the magnetoresistive (MR) sensor element, such that the layers employed within the magnetoresistive (MR) layered structure within the magnetoresistive (MR) sensor element are substantially planar.

The present invention provides a method for forming a magnetoresistive (MR) sensor element, such as a spin-valve magnetoresistive (MR) sensor element, where the spin-valve magnetoresistive (MR) sensor element has enhanced electrical and/or magnetic properties. The method of the present invention realizes the foregoing objects by employing when forming a magnetoresistive (MR) sensor element, which may be a spin-valve magnetoresistive (SVMR) sensor element, an ion etching of a seed layer and a pair of patterned conductor lead layer structures to form a corresponding ion etched seed layer and a pair of corresponding ion etched patterned conductor lead layer structures, prior to forming upon the ion etched seed layer and the pair of ion etched patterned conductor lead layer structures a magnetoresistive (MR) layered structure which may comprise a spin-valve magnetoresistive (SVMR) layered structure.

Similarly, the present invention also includes a specific geometric disposition of the pair of patterned conductor lead layer structures sunken within a dielectric isolation layer employed for forming the magnetoresistive (MR) sensor element, such that the layers employed within the magnetoresistive (MR) layered structure within the magnetoresistive (MR) sensor element are substantially planar.

The method of the present invention is readily commercially implemented. The present invention employs methods and materials as are otherwise conventional in the art of magnetoresistive (MR) sensor element fabrication, and in particular in the art of spin-valve magnetoresistive (SVMR) sensor element fabrication. Since it is a particular ordering of magnetoresistive (MR) sensor element fabrication methods which provides the present invention rather than the existence of particular methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which forms a material part of this disclosure, wherein.

DESCRIPTION OF THE PREFERRED EMBODIMENT

The present invention provides a method for forming a spin-valve magnetoresistive (SVMR) sensor element, where the spin valve magnetoresistive (MR) sensor element has enhanced electrical and/or magnetic properties. The method of the present invention realizes the foregoing objects by employing when forming a magnetoresistive (MR) sensor element which may be a spin-valve magnetoresistive (SVMR) sensor element an ion etching of a seed layer and a pair of patterned conductor lead layer structures contacting the seed layer to form an ion etched seed layer and a pair of ion etched patterned conductor lead layer structures prior to forming upon the ion etched seed layer and the pair of ion etched patterned conductor lead layer structures a magnetoresistive (MR) layered structure which may comprise a spin-valve magnetoresistive (SVMR) layered structure.

The present invention also includes a specific geometric disposition of the pair of patterned conductor lead layer structures sunken within a dielectric isolation layer employed for forming the magnetoresistive (MR) sensor element, such that the layers employed within the magnetoresistive (MR) layered structure within the magnetoresistive (MR) sensor element are substantially planar.

Although the preferred embodiment of the present invention illustrates the present invention within the context of forming a spin-valve magnetoresistive (SVMR) sensor element with enhanced electrical and/or magnetic properties, the present invention may also be employed when forming magnetoresistive (MR) sensor elements which employ magnetoresistive (MR) layered structures including but not limited to single stripe magnetoresistive (MR) layered structures, dual stripe magnetoresistive (DSMR) layered structures and spin-valve magnetoresistive (SVMR) layered structures.

Similarly, although the preferred embodiment of the present invention illustrates a spin-valve magnetoresistive (SVMR) sensor element which may be employed within digitally encoded magnetic data storage and retrieval employing a direct access storage device (DASD) magnetic data storage enclosure, magnetoresistive (MR) sensor elements, such as spin valve magnetoresistive (SVMR) sensor elements, fabricated in accord with the present invention may also be employed within: (1) digitally encoded magnetic data storage and transduction applications other than those employing direct access storage device (DASD) magnetic data storage enclosures; as well as (2) various analog magnetic data storage and transduction applications.

Figure 1:
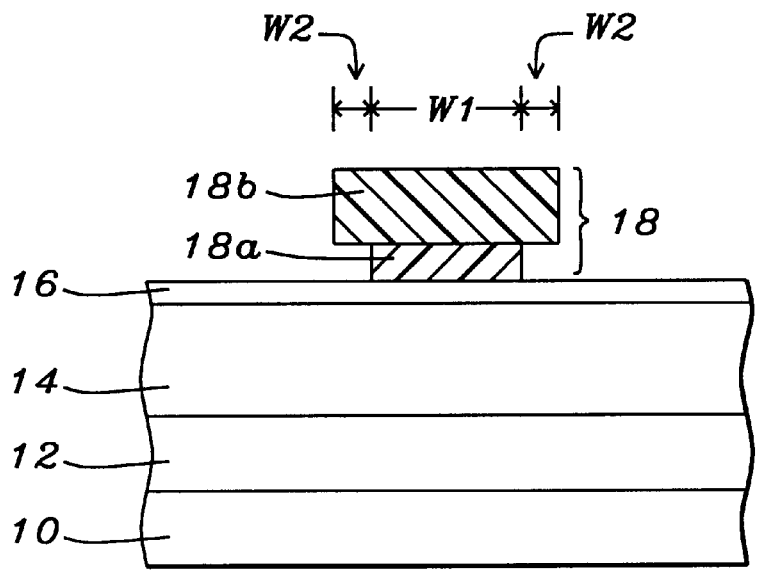
FIG. 1, FIG. 2, FIG. 3, FIG. 4 and FIG. 5 show a series of schematic air bearing surface (ABS) view diagram illustrating the results of progressive stages in forming a spin-valve magnetoresistive (SVMR) sensor element in accord with the present invention.

Referring now to FIG. 1 to FIG. 5, there is shown a series of schematic air bearing surface (ABS) view diagram illustrating the results of progressive stages in forming a spin-valve magnetoresistive (SVMR) sensor element in accord with a preferred embodiment of the present invention. Shown in FIG. 1 is a schematic cross-sectional diagram of the spin-valve magnetoresistive (SVMR) sensor element at an early stage in its fabrication in accord with the present invention.

Shown in FIG. 1 is a substrate 10 having formed thereover a series of three blanket layers. The series of three blanket layers includes: (1) a blanket shield layer 12 formed upon the substrate 10; (2) a blanket first dielectric isolation layer 14 formed upon the blanket first shield layer; and (3) a blanket seed layer 16 formed upon the blanket first dielectric isolation layer 14. Finally, there is also shown within FIG. 1 formed upon the blanket seed layer 16 a lift-off stencil 18, where the lift-off stencil 18 comprises: (1) patterned soluble underlayer 18a having formed symmetrically overhanging thereupon a patterned photoresist layer 18b. Each of the foregoing layers may be formed employing methods and materials as are otherwise conventional in the art of magnetoresistive (MR) sensor element fabrication, and more particularly within the art of spin-valve magnetoresistive (SVMR) sensor element fabrication.

For example, although it is known in the art of magnetoresistive (MR) sensor element fabrication that substrates are typically formed from non-magnetic ceramic materials such as but not limited to oxides, nitrides, borides and carbides, as well as homogeneous and heterogeneous mixtures of oxides, nitrides, borides and carbides, for the preferred embodiment of the present invention, the substrate 10 is preferably formed from a non-magnetic aluminum oxide-titanium carbide ceramic material. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval, although, as noted above, a magnetoresistive (MR) sensor element, such as a spin-valve magnetoresistive (MR) sensor element, fabricated in accord with the present invention may be employed within other digitally encoded magnetic data storage and transduction applications, as well as analog magnetic data storage and transduction applications.

Specifics of fabrication of a magnetoresistive (MR) sensor element formed in accord with the present invention into a direct access storage device (DASD) magnetic data storage enclosure employed within digitally encoded magnetic data storage and retrieval are conventional in the art of direct access storage device (DASD) magnetic data storage enclosure fabrication and are thus not provided here. Such details may be found, however, within various portions of the prior art references cited within the Description of the Related Art, all of the teachings of which prior art references are incorporated herein fully by reference.

Within the preferred embodiment of the present invention with respect to the blanket first shield layer 12, although it is known in the art of magnetoresistive (MR) sensor element fabrication that shield layers may be formed of soft magnetic materials including but not limited nickel, iron and cobalt soft magnetic materials, as well as alloys thereof, laminates thereof and laminates of alloys thereof, for the preferred embodiment of the present invention, the blanket first shield layer 12 is preferably formed of a permalloy nickel-iron (80:20, w:w) alloy. Typically and preferably, the blanket first shield layer 12 is formed to a thickness of from about 20000 to about 30000 angstroms upon the substrate 10.

Within the preferred embodiment of the present invention with respect to the blanket first dielectric isolation layer 14, although it is known in the art of magnetoresistive (MR) sensor element fabrication that blanket dielectric isolation layers may be formed from dielectric materials including but not limited to silicon oxide dielectric materials, silicon nitride dielectric materials and aluminum oxide dielectric materials, for the preferred embodiment of the present invention, the blanket first dielectric isolation layer 14 is preferably formed of an aluminum oxide dielectric material, as is most common in the art of magnetoresistive (MR) sensor element fabrication. Typically and preferably, the blanket first dielectric isolation layer 14 is formed to a thickness of from about 500 to about 1000 angstroms upon the blanket first shield layer 12.

Within the preferred embodiment of the present invention with respect to the blanket seed layer 16, the blanket seed layer 16 is typically and preferably formed of a material which in general enhances the magnetoresistive (MR) properties of a spin-valve magnetoresistive (SVMR) layered structure subsequently formed within the spin-valve magnetoresistive (SVMR) sensor element whose schematic air bearing surface (ABS) view diagram is illustrated within FIG. 1. Although there are several materials which may be employed to realize that object, it is typical and preferable within the art of magnetoresistive (MR) sensor element fabrication that seed layers upon which are formed magnetoresistive (MR) layered structures are formed of tantalum seed materials. Typically and preferably, the blanket seed layer 16 is thus formed of a tantalum seed material formed to a thickness of from about 100 to about 125 angstroms upon the blanket first dielectric isolation layer 14.

Finally, within the preferred embodiment of the present invention with respect to the lift off stencil 18 which comprises: (1) the patterned soluble underlayer 18a having formed symmetrically overhanging thereupon; (2) the patterned photoresist layer 18b, although other specific methods and materials may be employed when forming the lift off stencil 18: (1) the patterned soluble underlayer 18a is typically and preferably formed employing a polydimethylglutarimide (PMGI) soluble underlayer material; while (2) the patterned photoresist layer 18b may be formed from any of several photoresist materials as are conventional in the art of magnetoresistive (MR) sensor element fabrication. Although such photoresist materials may be selected from the group of photoresist materials including but not limited to positive photoresist materials and negative photoresist materials, positive photoresist materials are generally preferred within the art of magnetoresistive (MR) sensor element fabrication insofar as positive photoresist materials may typically be photodeveloped with more uniform linewidth control. Lift off stencil methods which employ polydimethylglutarimide (PMGI) materials for forming patterned soluble underlayers are generally known in the art of magnetoresistive (MR) sensor element fabrication and are disclosed in further detail within Chen et al., as cited within the Description of the Related Art, the teachings of which, as noted above, are incorporated herein fully by reference.

As is illustrated within the schematic cross-sectional diagram of FIG. 1, the patterned soluble underlayer 18a has a linewidth W1 typically and preferably from about 0.3 to about 1.5 microns upon the blanket seed layer 16, while the patterned photoresist layer 18b symmetrically overhangs the patterned soluble underlayer by an overhang linewidth W2 of from about 0.2 to about 0.4 microns. Although not specifically illustrated within the schematic cross-sectional diagram of FIG. 1, the patterned soluble underlayer 18a typically and preferably has a thickness of from about 600 to about 1000 angstroms, while the patterned photoresist layer 18b typically and preferably has a thickness of from about 6000 to about 10000 angstroms.

Figure 2:
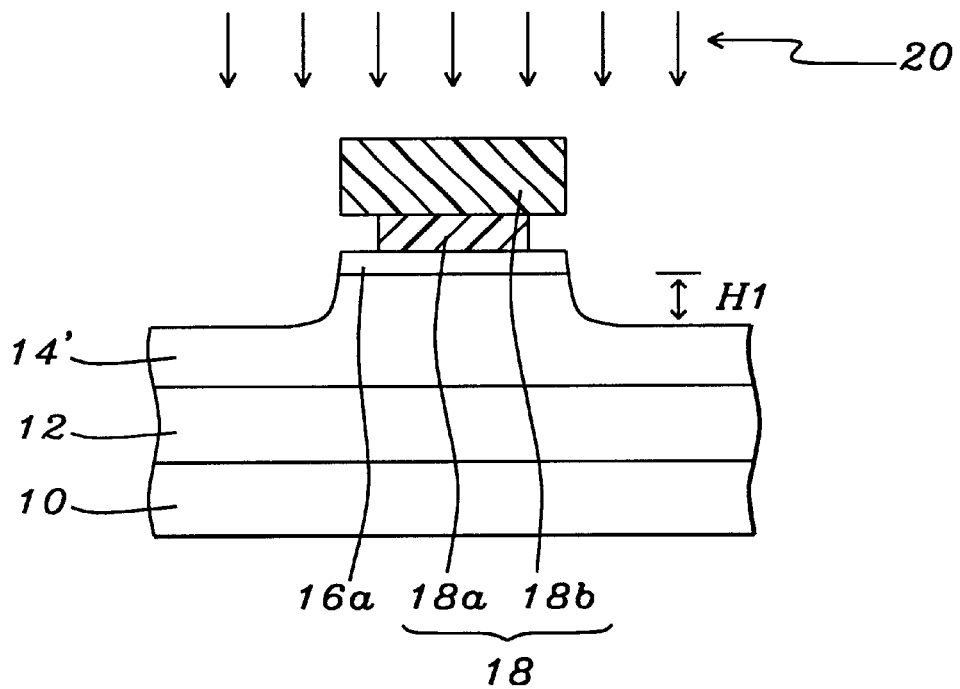

Referring now to FIG. 2, there is shown a schematic air bearing surface (ABS) view diagram of a spin-valve magnetoresistive (SVMR) sensor element illustrating the results of further processing of the spin-valve magnetoresistive (SVMR) sensor element whose schematic air bearing surface (ABS) view diagram is illustrated in FIG. 1.

Shown in FIG. 2 is an air bearing surface (ABS) view diagram of a spin-valve magnetoresistive (SVMR) sensor element otherwise equivalent to the spin-valve magnetoresistive (SVMR) sensor element whose schematic air bearing surface (ABS) view diagram is illustrated in FIG. 1, but wherein the blanket seed layer 16 and the blanket first dielectric isolation layer 14 have been sequentially ion etched, while employing a first ion etch 20, to form a patterned seed layer 16a and an ion etched recessed blanket first dielectric isolation layer 14'. Within the preferred embodiment of the present invention, the ion etched recessed blanket first dielectric isolation layer 14' is characterized by a mesa formed beneath and co-extensive with the patterned seed layer 16a, where the mesa separates a pair of recesses. The linewidth of the mesa and the co-extensive patterned seed layer 16a is determined largely by the linewidth of the patterned photoresist layer 18b within the lift off stencil 18. Although it is not essential within the method of the present invention that the blanket first dielectric isolation layer 14 be so etched while employing the first ion etch 20 to form the ion etch recessed blanket first dielectric isolation layer 14', such is preferred within the preferred embodiment of the present invention to provide optimized electrical and magnetic properties within a spin-valve magnetoresistive (SVMR) sensor element derived from the spin-valve magnetoresistive (SVMR) sensor element whose schematic air bearing surface (ABS) view diagram is illustrated in FIG. 2. As is illustrated within the schematic air bearing surface (ABS) view diagram of FIG. 2, each recess within the pair of recesses within the ion etched recessed blanket first dielectric isolation layer 14' is preferably formed to a depth H1 of from about 200 to about 400 angstroms, which depth H1 is designed to accommodate with planarizing characteristics a pair of patterned conductor lead layer structures subsequently formed within the pair of recesses within the spin-valve magnetoresistive (SVMR) sensor element whose schematic air bearing surface (ABS) view diagram is illustrated in FIG. 2.

Within the preferred embodiment of the present invention, the first ion etch 20 preferably employs an argon sputter etching ion and a first ion etch method employing the first ion etch 20 preferably employs: (1) a reactor chamber pressure of from about 5 to about 10 mtorr; (2) an argon sputter etching (i.e. ion milling) power of from about 200 to about 1000 watts.

Figure 3:
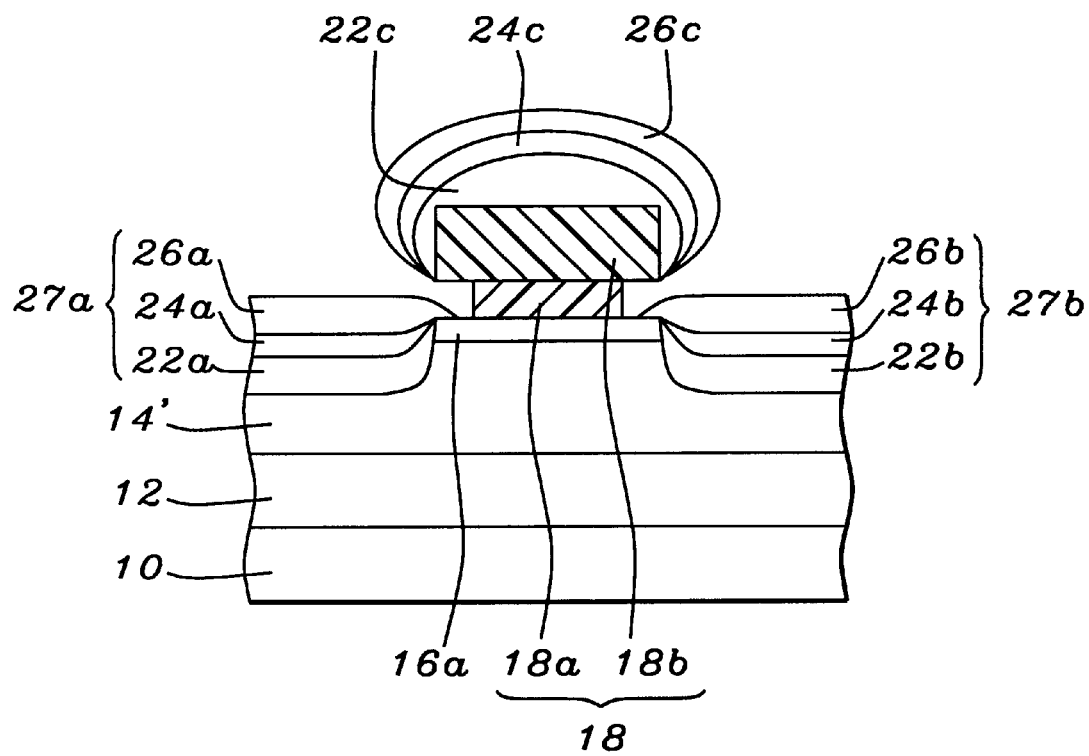

Referring now to FIG. 3, there is shown a schematic air bearing surface (ABS) view diagram of a spin-valve magnetoresistive (SVMR) sensor element illustrating the results of further processing of the spin-valve magnetoresistive (SVMR) sensor element whose schematic air bearing surface (ABS) view diagram is illustrated in FIG. 2.

Shown in FIG. 3 is a schematic air bearing surface (ABS) view diagram of a spin-valve magnetoresistive (SVMR) sensor element otherwise equivalent to the spin-valve magnetoresistive (SVMR) sensor element whose schematic air bearing surface view diagram is illustrated in FIG. 2, but wherein there is formed into the recessed portions of the ion etched recessed blanket first dielectric isolation layer 14' and bridging to the patterned seed layer 16a a pair of patterned conductor lead layer structures 27a and 27b comprising: (1) a pair of patterned conductor lead layers 22a and 22b having formed thereupon; (2) a pair of patterned seed layers 24a and 24b having formed thereupon; (3) a pair of patterned longitudinal magnetic biasing layers 26a and 26b. There is also shown within FIG. 3 formed upon the patterned photoresist layer 18b within the lift off stencil 18 a corresponding patterned conductor lead layer residue 22c having formed thereupon a corresponding patterned seed layer residue 24c in turn having formed thereupon a corresponding patterned longitudinal magnetic biasing layer residue 26c. Each of the foregoing three pair of patterned layers which comprise the pair of patterned conductor lead layer structures 27a and 27b, along with the corresponding three layer residues which are formed upon the patterned photoresist layer 18b, may be formed employing methods and materials as are conventional in the art of magnetoresistive (MR) sensor element fabrication.

For example, although it is known in the art of magnetoresistive (MR) sensor element fabrication that patterned conductor lead layers may be formed employing conductor lead materials including but not limited to gold, gold alloy, silver, silver alloy, copper and copper alloy conductor lead materials, for the preferred embodiment of the present invention, the patterned conductor lead layers 22a and 22b, as well as the patterned conductor lead layer residue 22c, are each preferably formed of a gold conductor lead material laminated upon a tantalum underlayer material. Preferably each of the patterned conductor lead layers 22a and 22b, and the patterned conductor lead layer residue 22c, is formed to a thickness of from about 300 to about 600 angstroms upon the ion etched recessed blanket first dielectric isolation layer 14' and bridging to the patterned seed layer 16a.

In addition, although it is also known in the art of magnetoresistive (MR) sensor element fabrication that seed layers are formed of seed materials typically and preferably selected within the context of materials upon which are formed those seed materials, and that thus under certain circumstances seed layers are optional within the art of magnetoresistive (MR) sensor element fabrication, for the preferred embodiment of the present invention when the patterned longitudinal magnetic biasing layers 26a and 26b are formed of certain types of hard magnetic biasing longitudinal magnetic biasing materials, the patterned seed layers 24a and 24b, as well as the patterned seed layer residue 24c, are preferably formed of a chromium seed material. Under such circumstances, the patterned seed layers 24a and 24b, and the patterned seed layer residue 24c, are each typically and preferably formed to a thickness of from about 50 to about 100 angstroms.

Finally, within the preferred embodiment of the present invention with respect to the patterned longitudinal magnetic biasing layers 26a and 26b, and the patterned longitudinal magnetic biasing layer residue 26c, although it is known in the art of magnetoresistive (MR) sensor element fabrication that longitudinal magnetic biasing layers may be formed from hard magnetic materials including but not limited to: (1) antiferromagnetic hard magnetic materials (such as but not limited to iron-manganese alloy antiferromagnetic hard magnetic materials, nickel-manganese alloy antiferromagnetic hard magnetic materials, iridium-manganese alloy antiferromagnetic hard magnetic materials and higher order alloys incorporating iron-manganese alloy antiferromagnetic hard magnetic materials, nickel-manganese alloy antiferromagnetic hard magnetic materials and iridium-manganese alloy antiferromagnetic hard magnetic materials); as well as (2) permanent magnet hard magnetic materials (such as but not limited to cobalt-platinum alloy permanent magnet hard magnetic materials and higher order alloys incorporating cobalt-platinum alloy permanent magnet hard magnetic materials), for the preferred embodiment of the present invention, the patterned longitudinal magnetic biasing layers 26a and 26b, and the patterned longitudinal magnetic biasing layer residue 26c, are each preferably formed of a cobalt-platinum alloy permanent magnet hard magnetic material of cobalt:platinum weight ratio from about 65:35 to about 80:20. Preferably, each of the patterned longitudinal magnetic biasing layers 26a and 26b, and the patterned longitudinal magnetic biasing layer residue 26c, is formed to a thickness of from about 100 to about 300 angstroms.

As is understood by a person skilled in the art, although the preferred embodiment of the present invention illustrates the patterned conductor lead layer structures 27a and 27b as being formed as a laminate comprising a pair of patterned conductor lead layers and a pair of patterned longitudinal magnetic biasing layers, there may under certain circumstances also be realized value within the present invention for a pair of patterned conductor lead layer structures formed only of a pair of patterned conductor lead layers and not including a pair of patterned longitudinal magnetic biasing layers laminated thereto.

Figure 4:
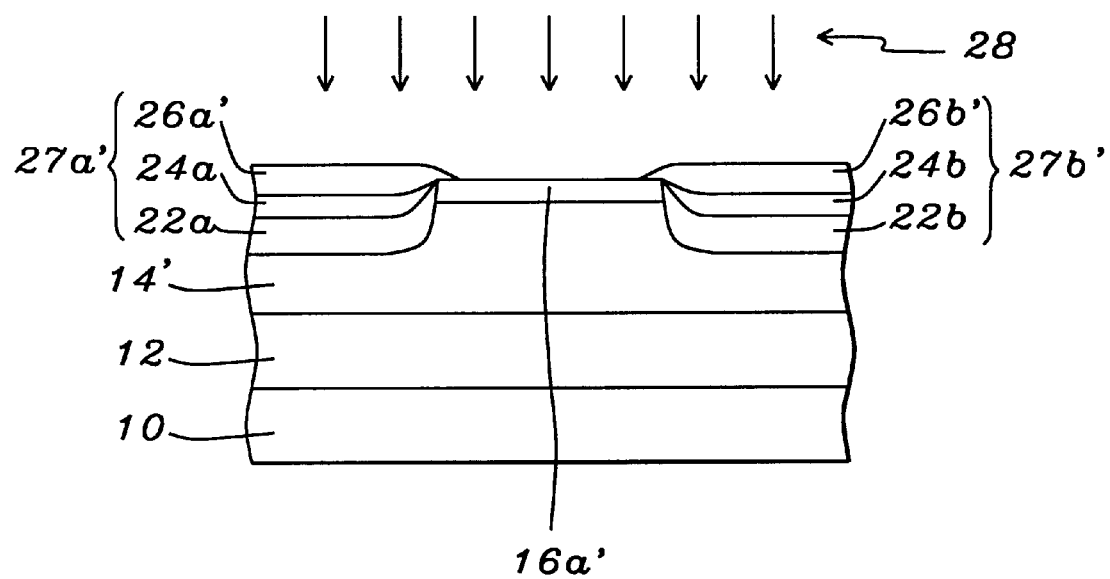

Referring now to FIG. 4, there is shown a schematic air bearing surface (ABS) view diagram of a spin-valve magnetoresistive (SVMR) sensor element illustrating the results of further processing of the spin-valve magnetoresistive (SVMR) sensor element whose schematic air bearing surface (ABS) view diagram is illustrated in FIG. 3.

Shown in FIG. 4 is a schematic air bearing surface (ABS) view of a spin-valve magnetoresistive (SVMR) sensor element otherwise equivalent to the spin-valve magnetoresistive (SVMR) sensor element whose schematic air bearing surface (ABS) view diagram is illustrated in FIG. 3, but wherein, in a first instance, there has been stripped from the spin-valve magnetoresistive (SVMR) sensor element the lift off stencil 18, which upon such stripping inherently takes with it the patterned conductor lead layer residue 22c, the patterned seed layer residue 24c and the patterned longitudinal magnetic biasing layer residue 26c. The lift off stencil 18 is stripped from the spin-valve magnetoresistive (SVMR) sensor element whose schematic air bearing surface (ABS) view diagram is illustrated in FIG. 3 to provide in part the spin-valve magnetoresistive (SVMR) sensor element whose schematic air bearing surface (ABS) view diagram is illustrated in FIG. 4 employing methods and materials as are conventional in the art of spin-valve magnetoresistive (SVMR) sensor element fabrication. Such methods will typically and preferably include a chemical stripping which employs an appropriate solvent which dissolves at least the patterned soluble underlayer 18a.

There is also shown within FIG. 4 a second ion etch 28 which etches the surfaces of the patterned longitudinal magnetic biasing layers 26a and 26b to form a pair of ion etched patterned longitudinal magnetic biasing layers 26a' and 26b' within a pair of ion etched patterned conductor lead layer structures 27a' and 27b', while simultaneously etching the surface of the patterned seed layer 16a to form an ion etched patterned seed layer 16a'.

Within the preferred embodiment of the present invention, the second ion etch 28 is preferably provided employing methods and materials analogous or equivalent to the methods and materials employed for providing the first ion etch 20, with the exception that the second ion etch 28 is employed for removing only a limited amount of material: (1) from the patterned longitudinal magnetic biasing layers 26a and 26b when forming the ion etched patterned longitudinal magnetic biasing layers 26a' and 26b'; and (2) from the patterned seed layer 16a when forming the ion etched patterned seed layer 16a'. Typically and preferably, the amount of such material removed is from about 20 to about 30 angstroms of the pertinent layer. Notwithstanding the removal of such minimal amount of material, the removal of the material provides for enhanced electrical and/or magnetic properties when forming a spin-valve magnetoresistive (SVMR) sensor element in accord with the preferred embodiment of the present invention through further processing of the spin-valve magnetoresistive (SVMR) sensor element whose schematic air bearing surface (ABS) view diagram is illustrated in FIG. 4.

As is illustrated within the schematic air bearing surface (ABS) view diagram of FIG. 4, the pair of ion etched patterned longitudinal magnetic biasing layers 26a' and 26b', and the ion etched patterned seed layer 16a', typically and preferably provide a substantially planar surface for further processing when fabricating while employing the spin-valve magnetoresistive (SVMR) sensor element whose schematic air bearing surface (ABS) view diagram is illustrated in FIG. 4 a spin-valve magnetoresistive (SVMR) sensor element in accord with the present invention. Within the context of the present invention, it is intended that such a substantially planar surface has a topography which varies by no greater than about 200 angstroms from a true planar surface which has no topographic variation.

Figure 5:
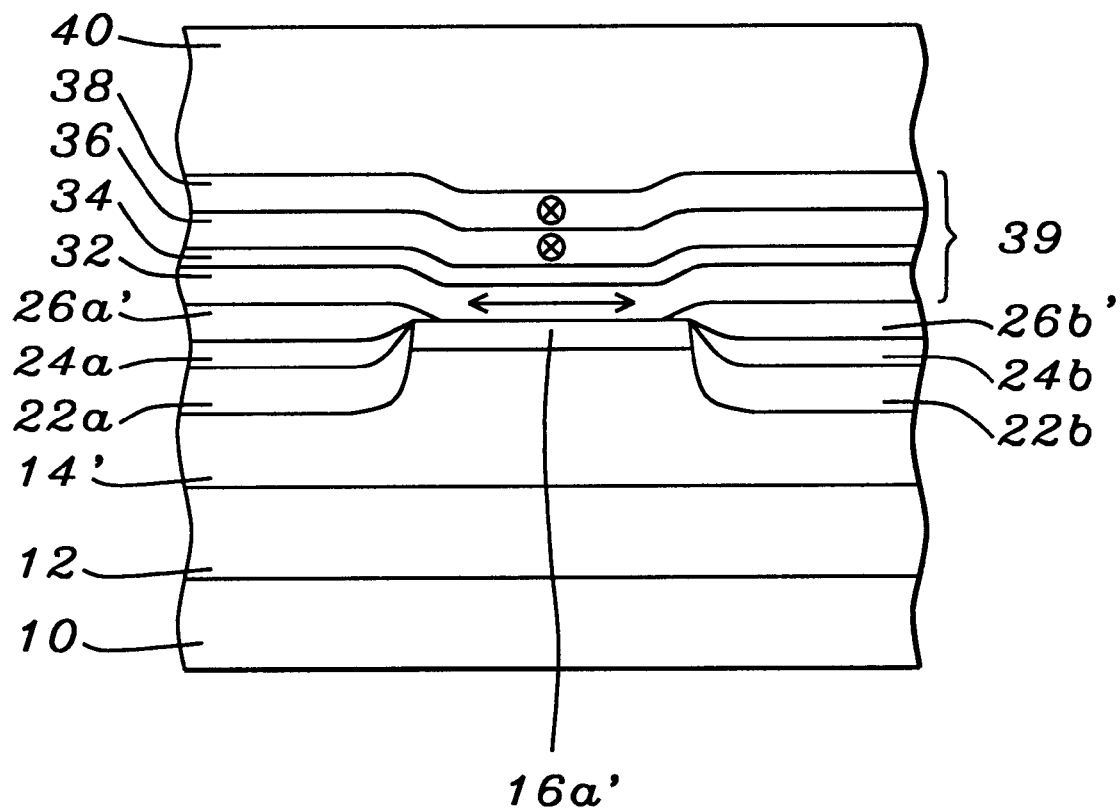

Referring now to FIG. 5, there is shown a schematic air bearing surface (ABS) view diagram of a spin-valve magnetoresistive (SVMR) sensor element illustrating the results of further processing of the spin-valve magnetoresistive (SVMR) sensor element whose schematic air bearing surface (ABS) view diagram is illustrated in FIG. 4.

Shown in FIG. 5 is a schematic air bearing surface (ABS) view diagram of a spin-valve magnetoresistive (SVMR) sensor element otherwise equivalent to the spin-valve magnetoresistive (SVMR) sensor element whose schematic air bearing surface (ABS) view diagram is illustrated in FIG. 4, but wherein there is formed upon the spin-valve magnetoresistive (SVMR) sensor element: (1) a series of four blanket layers which comprises a spin valve magnetoresistive (SVMR) layered structure 39, where the series of four blanket layers which comprises the spin-valve magnetoresistive (SVMR) layered structure 39 has formed thereupon; (2) a blanket second dielectric isolation layer 40. Within the preferred embodiment of the present invention, the series of four blanket layers which comprises the spin-valve magnetoresistive (SVMR) layered structure includes: (1) a blanket free ferromagnetic layer 32 formed upon exposed portions of the pair of ion etched patterned longitudinal magnetic biasing layers 26a' and 26b' and the ion etched patterned seed layer 16a'; (2) a blanket non-magnetic conductor spacer layer 34 formed upon the blanket free ferromagnetic layer 32; (3) a blanket pinned ferromagnetic layer 36 formed upon the blanket non-magnetic conductor spacer layer 34; and (4) a blanket pinning material layer 38 formed upon the blanket pinned ferromagnetic layer 36. Each of the foregoing four blanket layers which comprises the spin-valve magnetoresistive (SVMR) layered structure 39, as well as the blanket second dielectric isolation layer 40, may be formed employing methods and materials as are conventional in the art of magnetoresistive (MR) sensor element fabrication.

Although not specifically illustrated within the schematic cross-sectional diagrams of FIG. 4 and FIG. 5, the series of four blanket layers which comprises the spin-valve magnetoresistive (MR) layered structure 39 as illustrated within FIG. 5 is preferably formed upon the spin-valve magnetoresistive (MR) sensor element whose schematic air bearing surface (ABS) view diagram is illustrated in FIG. 4 sequentially in-situ in the same reactor chamber as is ion etched the patterned seed layer 16a to form the ion etched patterned seed layer 16a' and simultaneously ion etched the pair of patterned longitudinal magnetic biasing layers 26a and 26b to form the pair of ion etched patterned longitudinal magnetic biasing layers 26a' and 26b'. In the alternative, adjoining reactor chambers within a multi-chamber "cluster" reactor fabrication apparatus maintained at sub-atmospheric pressure may also be employed for sequentially, and with the exclusion of ambient atmosphere, forming the spin-valve magnetoresistive (SVMR) sensor elements whose schematic air bearing surface (ABS) view diagrams are illustrated in FIG. 4 and FIG. 5.

With respect to specific compositions for individual layers within the spin-valve magnetoresistive (SVMR) layered structure 39, as illustrated within FIG. 5, for example, within the preferred embodiment of the present invention with respect to both the blanket free ferromagnetic layer 32 and the blanket pinned ferromagnetic layer 36, both the blanket free ferromagnetic layer 32 and the blanket pined ferromagnetic layer 36 may be formed employing methods and ferromagnetic materials as are conventional in the art of magnetoresistive (MR) sensor element fabrication, such ferromagnetic materials, analogously with the blanket first shield layer 12, being formed from nickel, iron or cobalt ferromagnetic materials, alloys thereof, laminates thereof and laminates of alloys thereof. For the preferred embodiment of the present invention, the blanket free ferromagnetic layer 32 is more preferably formed of a permalloy nickel-iron (80:20, w:w) alloy of thickness about 30 to about 100 angstroms upon which is laminated a cobalt layer of thickness about 10 to about 20 angstroms, while the blanket pinned ferromagnetic layer 36 is preferably formed from a cobalt layer of thickness about 10 to about 30 angstroms upon which is laminated a permalloy nickel-iron (80:20, w:w) alloy of thickness from about 10 to about 40 angstroms, although alternative ferromagnetic material constructions may be employed for forming either or both of the blanket free ferromagnetic layer 32 and the blanket pinned ferromagnetic layer 36. Within both the blanket free ferromagnetic layer 32 and the blanket pinned ferromagnetic layer 36 of such laminated construction, the cobalt layers are intended as diffusion barrier layers to limit diffusion of the laminated permalloy layers within the blanket free ferromagnetic layer 32 and the blanket pinned ferromagnetic layer 36 with the non-magnetic conductor spacer layer 34.

Within the preferred embodiment of the present invention with respect to the blanket non-magnetic conductor spacer layer 34, although it is known in the art of spin-valve magnetoresistive (SVMR) sensor element fabrication that non-magnetic conductor spacer layers may be formed employing non-magnetic conductor materials including but not limited to gold, gold alloy, silver, silver alloy, copper and copper alloy non-magnetic conductor materials, for the preferred embodiment of the present invention, the blanket non-magnetic conductor spacer layer 34 is preferably formed of a copper material, as is most common within the art of spin-valve magnetoresistive (SVMR) sensor element fabrication, although other non-magnetic conductor materials may also be employed. Preferably, the blanket non-magnetic conductor spacer layer 34 is formed to a thickness of from about 20 to about 40 angstroms upon the blanket free ferromagnetic layer 32.

Finally, within the preferred embodiment of the present invention with respect to the blanket pinning material layer 38, although the blanket pinning material layer 38 may in general be formed employing materials as are employed for forming the patterned longitudinal magnetic biasing layers 26a and 26b, for the preferred embodiment of the present invention, the blanket pinning material layer 38, similarly with the patterned longitudinal magnetic biasing layers 26a and 26b, is preferably formed of a platinum-manganese hard magnetic pinning material. Typically and preferably, the pinning material layer 38 is formed to a thickness of from about 150 to about 300 angstroms upon the pinned ferromagnetic layer 36.

Similarly, within the preferred embodiment of the present invention with respect to the blanket second dielectric isolation layer 40, although the blanket second dielectric isolation layer 40 may be formed employing any of the several materials as may be employed for forming the blanket first dielectric isolation layer 14, the blanket second dielectric isolation layer 40 is preferably formed of the same aluminum oxide dielectric material as is employed for forming the blanket first dielectric isolation layer 14. Preferably, the blanket second dielectric isolation layer is formed to a thickness of from about 300 to about 1000 angstroms.

As is illustrated within the schematic air bearing surface (ABS) view diagram of FIG. 5, insofar as the pair of ion etched patterned longitudinal magnetic biasing layers 26a' and 26b' provide in conjunction with the ion etched patterned seed layer 16a' a substantially planar surface, each of the layers within the spin-valve magnetoresistive (SVMR) layered structure 39, as well as the blanket second dielectric isolation layer 40, is also formed analogously substantially planar. Such substantial planarity provides for limited electrical leakage from the spin-valve magnetoresistive (SVMR) layered structure 39 as illustrated within FIG. 5 to a blanket second shield layer subsequently formed upon the blanket second dielectric isolation layer 40. Such limited electrical leakage may be effected under the typical circumstance where the blanket free ferromagnetic layer 32 is centered within a gap defined by the blanket second shield layer and the blanket first shield layer 12, and when the blanket second dielectric isolation layer 40 must be formed of limited thickness due to intervening layers of the spin-valve magnetoresistive (SVMR) layered structure.

Upon forming the spin-valve magnetoresistive (SVMR) sensor element whose schematic cross-sectional diagram is illustrated in FIG. 1, there is formed a spin-valve magnetoresistive (SVMR) sensor element with an enhanced electrical and magnetic properties. The spin-valve magnetoresistive (SVMR) sensor element exhibits the enhanced electrical and magnetic properties since there is employed when fabricating the spin-valve magnetoresistive (SVMR) sensor element an ion etching of: (1) a pair of patterned longitudinal magnetic biasing layers within a pair of patterned conductor lead layer structures; and (2) a patterned seed layer, prior to forming upon the pair of ion etched patterned longitudinal magnetic biasing layers and the ion etched patterned seed layer a spin-valve magnetoresistive (SVMR) layered structure within the spin-valve magnetoresistive (SVMR) sensor element.

Similarly, electrical and magnetic properties within the spin-valve magnetoresistive (SVMR) sensor element of the present invention are also enhanced incident to forming within the preferred embodiment of the present invention an ion etch recessed blanket first dielectric isolation layer wherein there is formed within a pair of recesses within the ion etched recessed blanket first dielectric isolation layer a pair of patterned conductor lead layer structures employed within the spin-valve magnetoresistive (SVMR) sensor element of the preferred embodiment of the present invention. Since the pair of patterned conductor lead layer structures and a patterned seed layer may thus be formed substantially planar, there is less distortion when forming the spin-valve magnetoresistive (SVMR) layered structure within the spin-valve magnetoresistive (SVMR) sensor element of the preferred embodiment of the present invention.

As is illustrated within the schematic air bearing surface (ABS) view diagram of FIG. 5, to be fully operational, the spin-valve magnetoresistive (SVMR) sensor element whose schematic air bearing surface (ABS) view diagram is illustrated within FIG. 5 must have magnetization directions of the blanket free ferromagnetic layer 32 and the blanket pinned ferromagnetic layer 36 fixed with respect to each other, typically and preferably in orthogonal directions. As is illustrated within the schematic air bearing surface (ABS) view diagram of FIG. 5, typically and preferably, the magnetization direction of the blanket free ferromagnetic layer 32 will be parallel to the plane of the air bearing surface (ABS) of the spin-valve magnetoresistive (SVMR) sensor element whose schematic air bearing surface (ABS) view diagram is illustrated within FIG. 5. Similarly, as is also illustrated within the schematic air bearing surface (ABS) view diagram of FIG. 5, typically and preferably, the magnetization direction of the blanket pinned ferromagnetic layer 36 will be perpendicular to the plane of air bearing surface (ABS) of the spin-valve magnetoresistive (SVMR) sensor element whose schematic air bearing surface (ABS) view diagram is illustrated in FIG. 5. Such magnetization directions may be obtained employing magnetically assisted thermal annealing methods (at temperatures of up to about 300 degrees centigrade for time periods of up to about 5 hours) and magnetically assisted deposition methods as are conventional in the art of spin-valve magnetoresistive (SVMR) sensor element fabrication and disclosed in greater detail within the references cited within the Description of the Related Art, the teachings of which references, again, are incorporated herein fully by reference.

As is understood by a person skilled in the art, the spin-valve magnetoresistive (SVMR) sensor element whose schematic air bearing surface (ABS) view diagram is illustrated in FIG. 5 may be further fabricated employing additional layers and structures as are conventional in the art of magnetoresistive (MR) sensor element fabrication to provide a spin-valve magnetoresistive (SVMR) sensor element which is fully functional within a magnetic data storage and transduction application within which is employed the spin-valve magnetoresistive (SVMR) sensor element. Such additional layers and structures may include, but are not limited to, capping layers and structures, shield layers and structures, passivation layers and structures, conductor contact layers and structures and inductive magnetic write pole layers and structures. Resulting from such additional layers and structures fabricated incorporating the spin-valve magnetoresistive (SVMR) sensor element whose schematic air bearing surface (ABS) view diagram is illustrated within FIG. 5 may be a magnetic head selected from the group including but not limited to magnetoresistive (MR) read only magnetic heads, merged inductive write magnetoresistive (MR) read magnetic heads (which employ a pertinent magnetic material layer as both a shield layer for isolating a magnetoresistive (MR) sensor element within the merged inductive write magnetoresistive (MR) read magnetic head and as a magnetic inductor write pole layer within the merged inductive write magnetoresistive (MR) read magnetic head), and non-merged inductive magnetic write magnetoresistive (MR) read magnetic heads.

As is understood by a person skilled in the art, the preferred embodiment of the present invention is illustrative of the present invention rather than limiting of the present invention. Revisions and modification may be made to methods, materials, structures and dimensions employed for forming a spin-valve magnetoresistive (SVMR) sensor element in accord with the preferred embodiment of the present invention while still providing a spin-valve magnetoresistive (SVMR) sensor element formed in accord with the spirit and scope of the present invention, as defined by the appended claims.

What is claimed is:

1. A magnetoresistive (MR) sensor comprising:
   a substrate
   a dielectric isolation layer formed over the substrate, said dielectric isolation layer having a mesa formed therein, the mesa being covered by a seed layer and defined by a pair of recesses within the first dielectric isolation layer laterally disposed to either side of the mesa within the dielectric isolation layer;
   a pair of patterned conductor lead layer structures formed within the pair of recesses, said structures having an upper surface which is substantially co-planar with an upper surface of said seed layer; and
   a magnetoresistive (MR) layered structure formed over the seed layer and pair of patterned conductor lead layer structures.

2. The sensor of claim 1 wherein the patterned conductor lead structure is either a patterned conductor lead layer alone or a patterned conductor lead layer laminated with a patterned seed layer and a patterned longitudinal magnetic biasing layer.

3. The sensor of claim 1 wherein the magnetoresistive MR) layered structure is selected from the group consisting of single stripe magnetoresistive (MR) layered structures, dual stripe magnetoresistive (MR) layered structures and spin-valve magnetoresistive (SVMR) layered structures.

* * * * *